United States Patent [19]

Guerra

[11] 4,140,897
[45] Feb. 20, 1979

[54] ELECTRONIC DIGITAL SEQUENTIAL COUNTERS

[76] Inventor: David J. Guerra, 23 Benham St., Springfield, Mass. 01109

[21] Appl. No.: 844,734

[22] Filed: Oct. 25, 1977

[51] Int. Cl.² .............................................. G06M 3/14
[52] U.S. Cl. ......................... 235/92 CP; 235/92 DN; 235/92 R; 364/705; 235/92 V; 235/92 EV
[58] Field of Search .......... 235/92 CP, 92 DN, 92 V, 235/92 EV, 92 MP, 92 PB; 364/705, 707

[56] References Cited
U.S. PATENT DOCUMENTS

| | | | |
|---|---|---|---|
| 3,654,449 | 4/1972 | Boyce | 235/92 CP |
| 3,777,126 | 12/1973 | Hoff | 235/92 ST |

*Primary Examiner*—Joseph M. Thesz

[57] ABSTRACT

An electronic digital sequential counter in which a calculator chip, namely the Texas Instrument Corp.'s chip #TMS0972NL, is the single counting element. The count number is displayed on an LED readout that is compatible with the chip, and can accommodate up to eight (8) place figures with sign and floating decimal. The chip is programmed to count by a simple keyboard sequence consisting of the desired counting interval N followed by the "addition" function, and then N. The count is executed by triggering the "equals" function at each occurrence of the event to be counted. The counting interval N will add upon itself with every operation of the "equals" function. This function can be operated by several means by the event to be counted. A shaft rotation count encoder is described in which the "equals" function operating switch is arranged to close, thus allowing an event count, upon the occurrence of discrete events encoded on a rotating drum that is mechanically linked to the rotating shaft to be counted. A shaft rotation direction encoder is described in which a switch is closed mechanically, electromagnetically, optically or otherwise upon a change of direction in the shaft rotation. This switch operates the "change sign" function on the chip and so instructs the chip as whether to count down or to count up.

12 Claims, 7 Drawing Figures

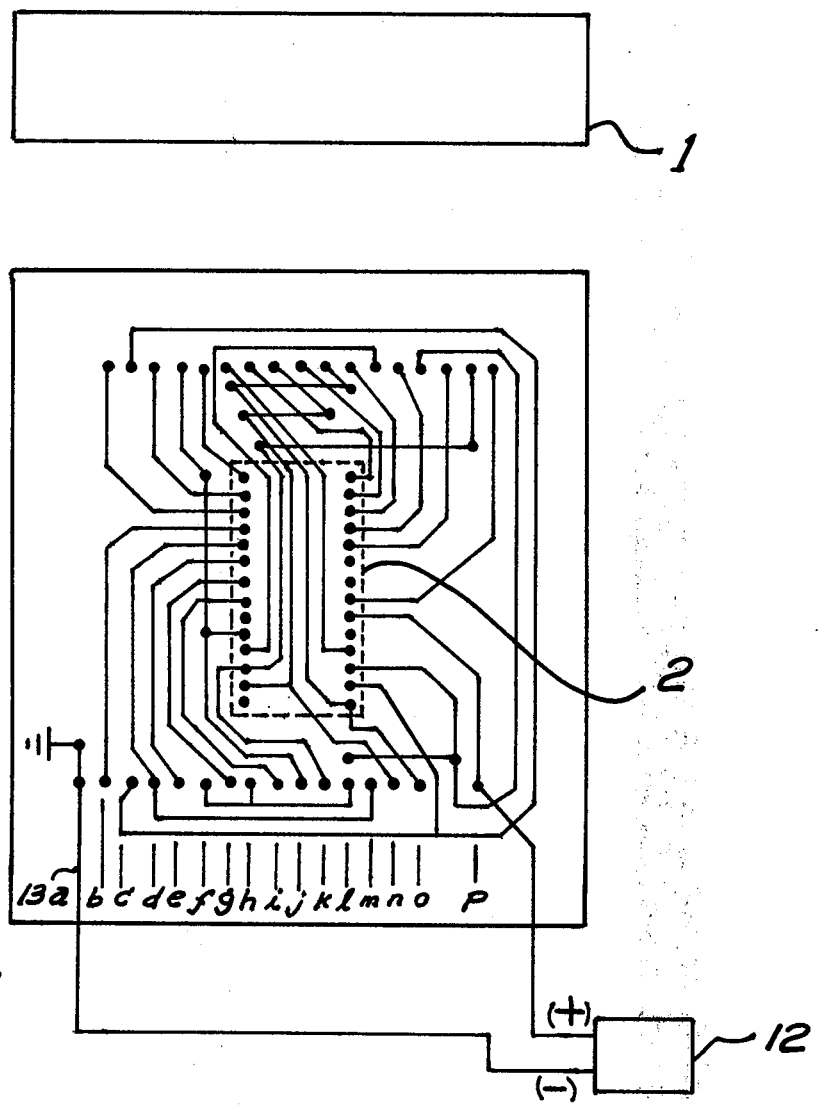
Fig 1
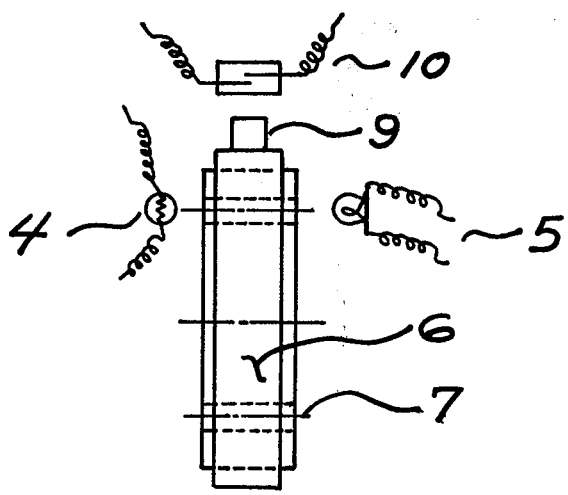

ELECTRONIC DIGITAL SEQUENTIAL COUNTERS

The present invention relates to improvements in electronic counting devices and, more particularly, to novel and improved electronic digital sequential counters of economical manufacture and simple, compact, and portable design that are easily and quickly programmed to count by any desired numeric interval any objects or shaft rotations.

The current day state of the art electronic digital counters on the market are quite expensive, the approximate price range being $250.00 and up, typically. The designs of these counters are usually fairly complex, utilizing several integrated circuit chips. The normal counting interval is the numeral one (1), so that if a shaft whose rotations are to be counted rotates one full cycle, or 360 degrees, then the counting system would have to be triggered 360 times to register 360 degrees as the final degree count. Most systems do not provide programmable count intervals, whether the the integrated circuit counters are decade or binary, and those that do are very costly. In accordance with the present teachings, however, the above problems of economy and programability are solved quite simply through the use of the counting function of a calculator chip (specifically the Texas Instrument chip #TMS0972NL for illustrative purpose, but many other calculator chips on the market will serve equally well with some modification from what will be described in this specification). The use of a calculator chip allows the counting interval to be programmed through the simple keyboard sequence of "N + N" where N is the desired counting interval. Counting is then achieved by allowing the events to be counted to operate the "equals" function on the chip. Economy is of course inherent in such a single chip design; the approximate market value of all the electronics in the system to be described here is less than $10.00. And because the only power supply needed for this counter is a nine volt transistor-type battery, the device is completely portable and compact in it's physical dimensions. Any "off-on-off" switching device will operate the "equals" function on the calculator chip, making the counter very versatile in its ability to count almost any type of event. As an example, one use of the counter is for a positional readout for an astronomical telescope. Specifically, the declination axis of the mounting of such a telescope is read in degrees from 0 to 360. A gear unit whose output shaft rotates a hundred times for every rotation of the declination shaft input is attached to a cylinder with four equally spaced permanent magnets about its circumference, so that a magnetic reed switch placed in the field of the magnets will switch on 400 times for a single rotation of the telescope about its declination axis. Therefore, if the magnetic reed switch is operating the "equals" function on the calculator chip, each operation will represent 360/400 or 0.9 degrees of declination axis rotation. Hence, one would program the chip to count in intervals of 0.9 in the manner "0.9 + 0.9". A shaft rotation direction encoder will be described that operates the "change sign" function on the chip, causing the chip to count down or count up, so that in this example a change in declination rotation direction would cause the chip to subtract in intervals in 0.9 degrees.

It is one of the objects of the present invention, therefore, to provide a novel and improved electronic digital sequential counter wherein the design is made both simple and economical by means of utilizing the counting functions of a single calculator chip.

Another object is to provide programable counting ability, wherein any counting interval desired may be programmed into the calculator chip through the simple keyboard chip access.

Still further, it is an object to provide the features of compactness and portability in the electronic digital sequential counter, features that are inherent in the solid state single chip design with the nine volt transistor-type battery power supply.

And further, it is an object to provide an electronic digital sequential counter capable of counting shaft rotations and capable of sensing and correcting for rotation direction changes. This is provided by means of a simple shaft rotation count encoder and shaft rotation direction encoder, respectively.

Finally, it is an object to provide an electronic digital sequential counter that is flexible and adaptable with regards to the means of operating the counting function of the calculator chip in that any type of "off-on-off" switching device can be used.

FIG. 1 is a schematic of the digital counter in which the present teachings are exploited to advantage;

The assembly illustrated in FIG. 1 represents an electronic digital sequential counter that utilizes a single calculator chip as its sole counting element, thus being of an economical and portable design, while providing count interval programability and versatility in counting. The integrated circuit calculator chip 2 (Texas Instrument Co.'s #TMS0972NL) is wired to a Light Emitting Diode readout (hereafter to be referred to as an LED readout) that is compatible with the aforementioned calculator chip. The LED readout is 1 in FIG. 1; for purpose of illustration, it is the Texas Instrument Co.'s #TIL395-8. The said LED readout is wired to the aforementioned calculator chip in the manner represented by the schematic wiring portion of FIG. 1. Power is supplied to the said calculator chip and the said LED by a nine volt D.C. transistor-type battery 12, where the negative (ground) terminal connects to pin 13A of the said calculator chip and the positive terminal connects to pin 13P of the same calculator chip. Pins 13B through 13O of the calculator chip are the keyboard switch inputs to the said calculator chip, where pins 13E and 13K operate the "change sign" function, pins 13C and 13I operate the "addition" function, pins 13K and 13M operate the "clear" function, pins 13G and 13H operate the "decimal" function; the numeral functions are as follows:

pins 13E and 13F operate "0,"
pins 13C and 13D operate "1,"

pins 13C and 13E operate "2,"
pins 13C and 13G operate "3,"
pins 13D and 13O operate "4,"
pins 13E and 13O operate "5,"
pins 13G and 13O operate "6,"
pins 13M and 13N operate "7,"
pins 13E and 13N operate "8,"
pins 13G and 13N operate "9."

Several other functions of the aforementioned calculator chip that are not essential to the operation of the counter are listed here as general information: pins 13J and 13M operate the "clear memory" function, pins 13J and 13E operate the "recall memory" function, pins 13J and 13L operate the "memory add" function, pins 13J and 13G operate the "memory subtract" function, pins 13G and 13K operate the "percent" function, pins 13I and 13N operate the "multiplication" function, pins 13I and 13K operate the "division" function, and pins 13L and 13M operate the "clear entry" function. While these last functions are non-essential to the operation of the counter, as stated, they do allow for full calculator use when the counting functions are not in use; this is a useful feature of the electronic digital sequential counter described here.

Figure 3:
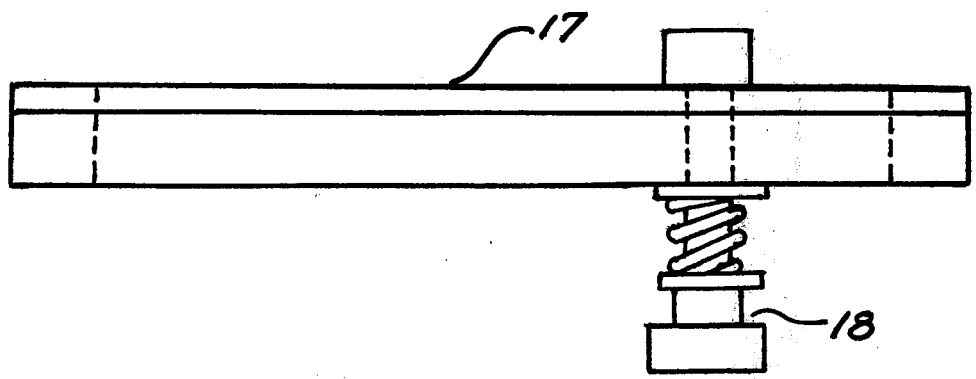
FIG. 3 is a side view (plan) of the slide switch programmer showing the magnetic reed switch assembly.
Figure 4:
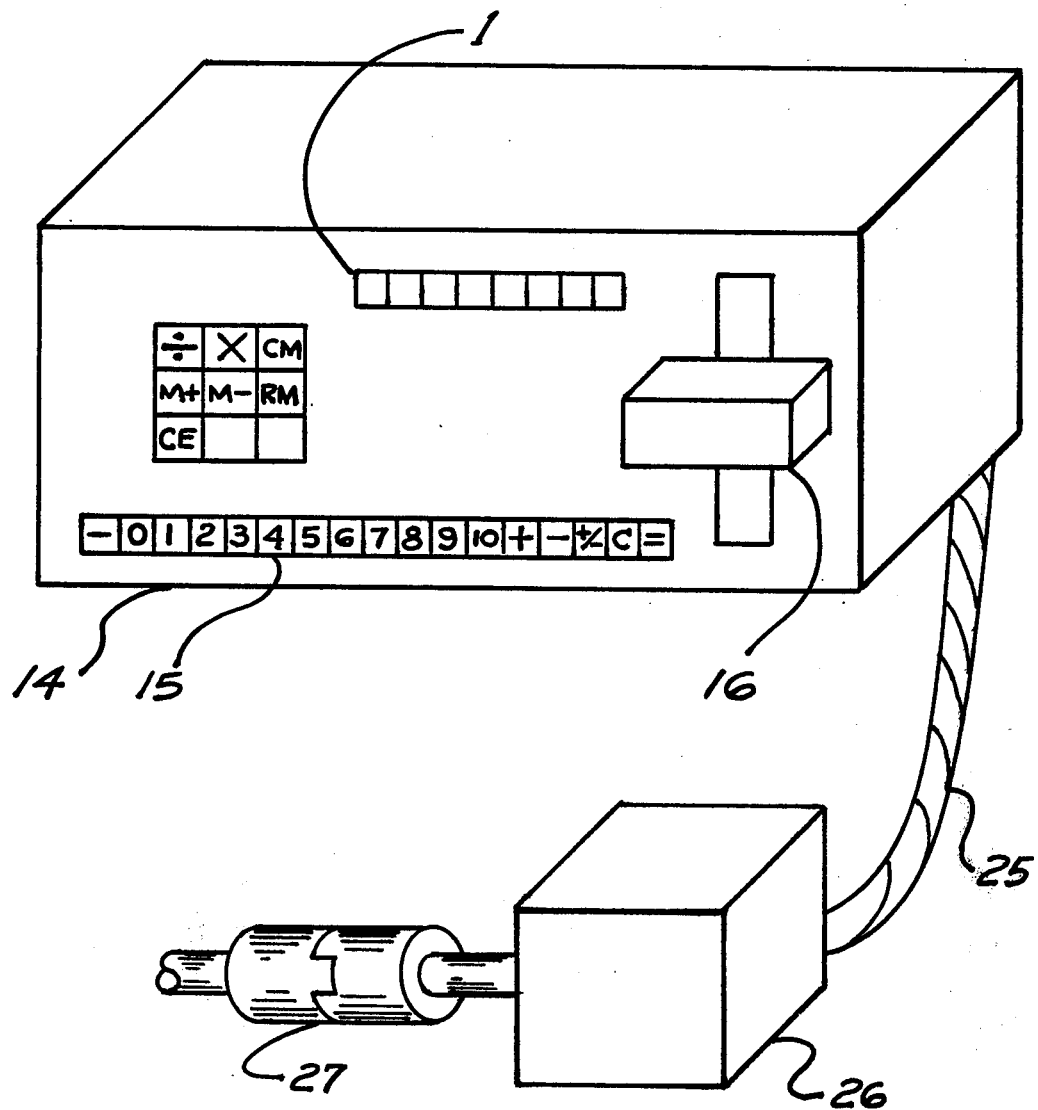
FIG. 4 is a pictorial view of one form of assembled digital sequential counter, displaying a mechanical shaft rotation counter composed of a gear reduction unit and the optical counter displayed in FIG. 2.
Figure 5:
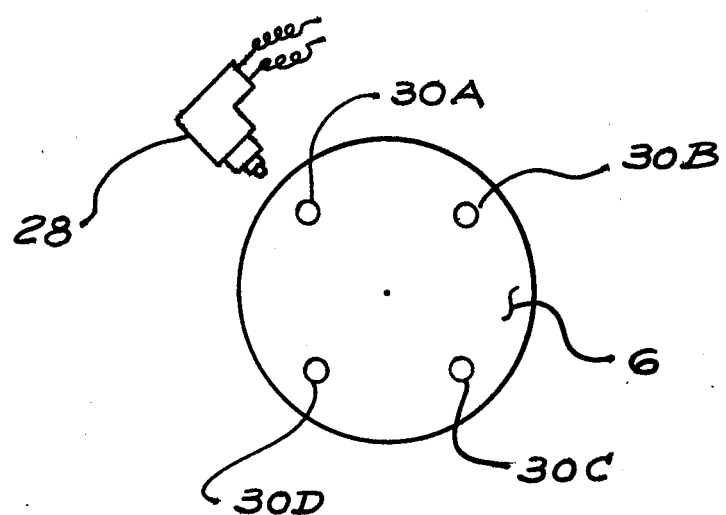
FIG. 5 is a top pictorial view of a counter assembly utilizing mechanical switching.
Figure 6:
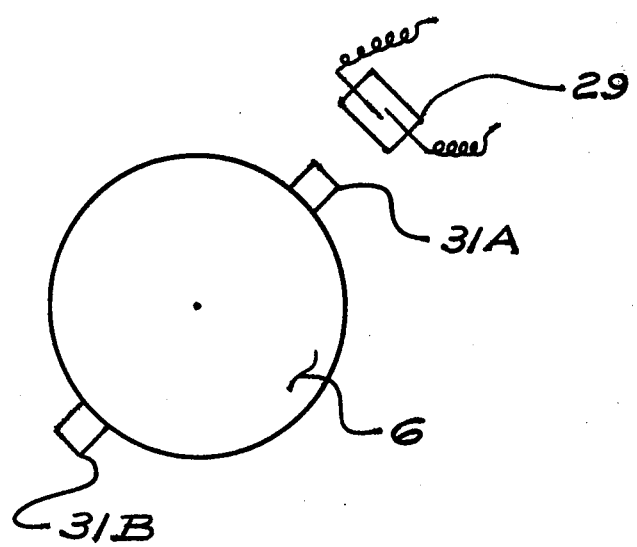
FIG. 6 is a top pictorial view of a counter assembly utilizing magnetic switching.
Figure 7:
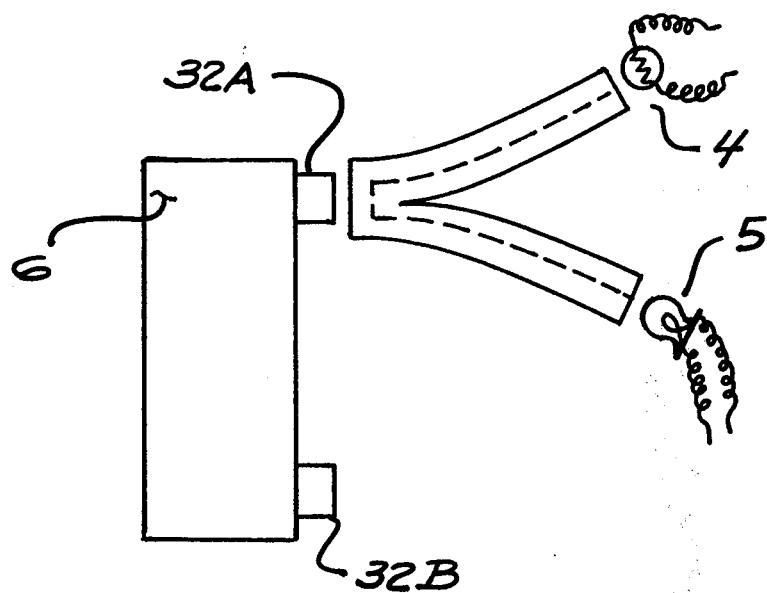
FIG. 7 is a side pictorial view of a counter assembly utilizing reflective optical switching.

A solid cylinder of plastic, metal, or other suitable material is shown as number 6 in FIG. 1 through FIG. 7; this cylinder is linked mechanically to the rotating shaft that is to be counted through the use of belts, gears, friction, magnetic clutch, or other such suitable link. In FIG. 1, the cylinder is presented in a cross-sectional view that also shows a photoswitch 4 that is operating the "equals" function of the calculator chip, a light source 5 that is powered by the aforementioned nine-volt D.C. transistor type battery, and a finite number of holes which lie parallel to the axis of rotation of the said cylinder. The said hole(s) 7 are further positioned in a circle concentric with the circumference of the said cylinder and are equally spaced about this circle. The said cylinder, holes, light source, and photoswitch embody the shaft rotation count encoder in an optical form, which is only one possible form of many. As stated previously, the essence of the shaft rotation count encoder is the encoding or placement of a finite number of equally spaced discrete events in a circle on the said cylinder body, concentric with the axis of rotation of the said cylinder. The discrete events need only be able to trigger a single switch outside of the said cylinder but in the proximity of the discrete events, said switch then operating the "equals" function on the aforementioned calculator chip, which then counts the occurrence of the said discrete events. Said discrete events and said switch may be of an optical nature, as illustrated here and in FIGS. 1 and 7, or of a mechanical nature, as illustrated in FIG. 5, or of an electromagnetic nature, as illustrated in FIG. 6, or of an acoustic, thermal, or chemical nature. By way of example of one optical form, the aforementioned photoswitch and light source (where the light source may be an LED, a filament bulb, or other illumination) are aligned with each other and with the said holes, such that when a hole passes between the photoswitch and the light source, the photoswitch is triggered and operates the "equals" function on the said calculator chip, thus allowing the said hole to be counted. FIG. 7 illustrates another optical form of shaft rotation count encoder where mirror segments 32 are the discrete events to be counted, rather than the aforementioned holes, and the light source 5 and photoswitch 4 are integral to a bifurcated fiber optic bundle 33 that is aimed at the said mirrors. In FIG. 6 the discrete events are permanent magnets 31 that trigger the magnetic reed switch 29 that is in the field of the closest said permanent magnet. And FIG. 5 is the mechanical form, or one such example, where the discrete events are protruding lobes 30 from the aforementioned cylinder that trigger the microswitch 28.

Figure 2:
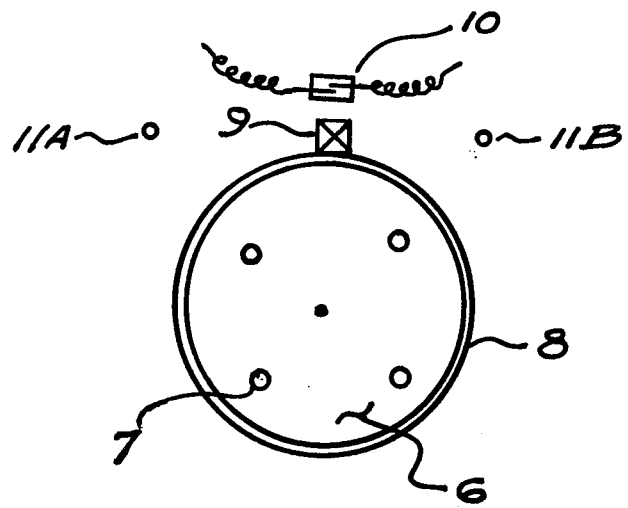
FIG. 2 is a top view (plan) of optical shaft rotation counter such as that illustrated in cross-sectional view in FIG. 1, with the shaft direction encoder exposed.

The shaft rotation direction encoder is comprised of a circular band 8 of nylon, metal, or other suitable material that encompasses the aforementioned rotating cylinder and exerts a slight friction force against said cylinder, a discrete event 9 that is attached to the said band but protrudes from it radially (for purpose of illustration, the discrete event will be of an electromagnetic form, specifically a permanent magnet), and an off/on/off type switch that is triggered by the discrete event, which in this case is a magnetic reed switch 10 in FIG. 1 and FIG. 2. This said magnetic reed switch is placed in the proximity of the aforementioned permanent magnet in such a manner that it is triggered by the said magnet only when the magnet is closest to it during the magnet's segmented arc of travel between two stops 11A and 11B; when the aforementioned cylinder rotates in one direction, the said protruding permanent magnet rotates with it, by way of the slight friction between the aforementioned band and the cylinder, until it is stopped by the said stop. The cylinder continues to rotate within the band. Now if the said cylinder is to change direction, the protruding magnet will again travel with the cylinder by means of friction, travelling away from stop 11A and toward stop 11B; midway between the two said stops (a sgement of 15° to 45°) the said protruding magnet passes close enough to the aforementioned magnetic reed switch to trigger it, said switch then operating the "change sign" function on the aforementioned calculator chip that causes the chip to count in the direction opposite to that of the previous rotation direction. Sometimes, the "change sign" function is operated coincidentally with one of the "equals" functions, which can cause confusion in the calculator chip. To avoid this, the aforementioned stops can be magnetic reed switches that are connected in parallel, this parallel set of switches then placed in series with the switch that operates the "equals" function of the calculator chip, in between the switch and the calculator switch. In this arrangement, as long as the said protruding permanent magnet rests against one of these said magnetic reed switch/stops, the "equals" function can be operated; but with the protruding magnet in between the two magnetic reed switches, when it is triggering the "change sign" function, neither magnetic reed switch will be closed, so preventing the "equals" function from coinciding with the "change sign" function. As with the rotation count encoder, the protruding magnet and corresponding magnetic reed switch are, respectively, the discrete event and the switch triggered by the discrete event. Accordingly, the form of both discrete event and switch may mechanical, optical, thermal, electromagnetic, acoustic, or chemical in nature.

FIG. 3 represents a side view of the programming slide switch that is comprised of a spring-loaded lever handle 16 which protrudes above and below a flat plate 17 and is restricted in travel by a groove cutout in the said flat plate. The part of the said lever that protrudes below the plate has a permanent magnet 18 attached to it. Along the path to which the lever travel is restricted are a number of magnetic reed switches, each of which is operating a specific function in the programming sequence that consists of "N + N", where N is the desired counting interval and can be any combination of the numerals and decimal point. The aforementioned magnetic reed switches 19 through 24 are arranged in the proper programming sequence so that one travel of the said lever along the said groove from one end to the other will program the counting sequence into the said calculator chip by means of passing the said permanent magnet near each of the aforementioned magnetic reed switches.

In FIG. 4 the entire electronic digital sequential counter is seen pictorially, housed in the parallelopiped container 14 with the LED readout 1, the slide programming switch 16, the programming and calculator keyboards 15 and the calculator chip and power supply housed together. The cable 25 carries the "equals" and "change sign" function connections to the remote shaft rotation count/direction encoder 26 that is connected to the rotating shaft 27.

It will be evident to those skilled in the art that the illustrated embodiments of electronic digital sequential counters may be altered for certain purposes; in particular, the LED (Light Emitting Diode) may be replaced by LED readouts of other manufacturers, or by other types of readouts such as the LCD (Liquid Crystal Display), Nixie tube displays, or fluorescent tube displays; other keyboard switch and programming switches of different arrangements and/or type may be employed; other similar integrated circuit calculator chips manufactured by other companies may be employed with slight modification; other means of encoding the shaft direction and pulse counting, such as mechanical, electrical, optical, thermal, or chemical may be used. Accordingly, it should be understood that the specific constructional details here illustrated and described are presented for purpose of disclosure rather than as limitations, and that in the appended claims it is aimed to cover all such modifications and equivalencies as fall within the true spirit and scope of the invention.

What I claim as new and desire to secure by Letters Patent of the United States is:

1. An electronic digital sequential counter comprising:
   A. an integrated circuit calculator chip that has an "equals" function, a "change sign" function, an "addition" function, a "clear entry" function, a "decimal point" function, and the functions corresponding to the numerals "0, 1, 2, 3, 4, 5, 6, 7, 8, 9," such that each time the said "equals" function is operated by the event to be counted, a counting interval N will be added upon itself, where the said counting interval N is comprised of any desired combination of the aforementioned numerals and the decimal point, and where the aforementioned calculator chip is programmed to count in intervals of N by the sequence of functions "N + N" and "+" is the aforementioned addition function;
   B. an LED (Light Emitting Diode) readout compatible with aforementioned integrated circuit calculator chip, or other compatible readouts;
   C. a programming keyboard comprised of an array of switch devices of the off/on/off type that operate the said functions of the said calculator chip;
   D. a shaft rotation count encoder comprising a cylinder that is linked mechanically or otherwise to the rotating shaft which is to be counted so that said cylinder rotates in a direct ratio to the said rotating shaft, and a finite number of discrete events placed on the said cylinder in a circle concentric with the axis of rotation of said cylinder, said events being equally spaced on this concentric circle, and said events being of a nature that can trigger an off/on/off switch that operates the aforementioned "equals" function on the aforementioned calculator chip;
   E. a shaft rotation direction encoder comprising a circular band that encompasses the aforementioned rotating cylinder and exerts a slight friction force against said cylinder, a discrete event which protrudes away from and yet is part of the said band, two stops placed to either side of said protruding discrete event, said stops being positioned just outside of said band and a small number of degrees apart from each other, and an off/on/off switch that is triggered by the said discrete event protruding from said band and that operates the "change sign" function of the aforementioned calculator chip.

2. An electronic digital sequential counter as claimed in claim 1, in which the integrated circuit calculator chip is the Texas Instrument Co.'s #TMS0972NL.

3. An electronic digital sequential counter as claimed in claim 1, in which the readout is of the Light Emitting Diode type made by the Texas Instrument Co., #TIL395-8 7637.

4. An electronic digital sequential counter as claimed in claim 1, in which the programming sequence "N + N" is preset into an array of off/on/off switches that are arranged in sequence such that a slide mechanism that is so constructed as to trigger the switches will complete the programming sequence with one operation.

5. An electronic digital sequential counter as claimed in claim 1, in which the discrete events of the shaft rotation count encoder and the shaft rotation direction encoder are holes that allow a light source placed to one side of said holes to activate a photoswitch on the other side of said hole, or in which the discrete events are mirrors that allow the light source in a bifurcated fiber optic bundle that is aimed at the mirrors to activate the photoswitch that is in the same bifurcated fiber optic bundle, said photoswitch in both cases operating the aforementioned "equals" function or the aforementioned "change sign" function, as the case may be, of the aforementioned calculator chip.

6. An electronic digital sequential counter as claimed in claim 1, in which the discrete events are of an optical nature.

7. An electronic digital sequential counter as claimed in claim 1, in which the discrete events are permanent magnets and the switch that operates the "equals" function or the "change sign" function of the aforementioned calculator chip is a magnetic reed switch that is of the off/on/off type and that is activated by the said permanent magnets.

8. An electronic digital sequential counter as claimed in claim 1, in which the discrete events of the aforementioned shaft rotational count and direction encoders are of an electromagnetic nature.

9. An electronic digital sequential counter as claimed in claim 1, in which the discrete events of the aforementioned shaft rotational count and direction encoders are of a mechanical nature.

10. An electronic digital sequential counter as claimed in claim 1, in which the discrete events of the aforementioned shaft rotational count and direction encoders are of a thermal nature.

11. An electronic digital sequential counter as claimed in claim 1, in which the discrete events of the aforementioned shaft rotational count and direction encoders are of an acoustic nature.

12. An electronic digital sequential counter as claimed in claim 1, in which the "equals" function of the aforementioned calculator chip is operated by any optical, mechanical, electromagnetic, acoustic, thermal, or chemical switching device.

* * * * *